Figure 1:
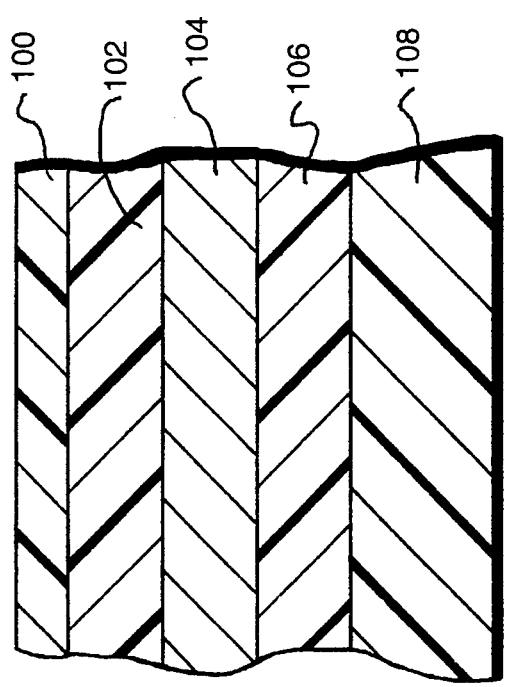

United States Patent [19]

Lewis et al.

[11] Patent Number: 5,354,633
[45] Date of Patent: Oct. 11, 1994

[54] LASER IMAGEABLE PHOTOMASK CONSTRUCTIONS

[75] Inventors: Thomas E. Lewis, E. Hampstead; Michael T. Nowak, Leominster, both of Mass.

[73] Assignee: Presstek, Inc., Hudson, N.H.

[21] Appl. No.: 125,321

[22] Filed: Sep. 22, 1993

[51] Int. Cl.$^5$ .............................................. G03F 9/00
[52] U.S. Cl. .......................................... 430/5; 430/201; 430/271; 430/273
[58] Field of Search ................ 430/5, 20, 273, 323, 430/271; 428/408

[56] References Cited

U.S. PATENT DOCUMENTS

| | | | |
|---|---|---|---|
| 2,554,017 | 5/1951 | Dalton | 117/33.5 |
| 2,983,220 | 5/1961 | Dalton et al. | 101/149.2 |
| 3,048,515 | 8/1962 | Dalton | 162/126 |
| 3,158,506 | 11/1964 | Ellison | 117/216 |
| 3,283,704 | 11/1966 | Dalton | 101/128.2 |
| 3,411,948 | 11/1968 | Reis | 117/217 |
| 3,509,088 | 4/1970 | Dalton | 260/41 |
| 3,934,503 | 1/1976 | Kinney et al. | 101/128.2 |
| 3,945,318 | 3/1976 | Landsman | 101/467 |
| 3,962,513 | 6/1976 | Eames | 428/323 |
| 3,964,389 | 6/1976 | Peterson | 101/467 |
| 4,054,094 | 10/1977 | Caddell et al. | 101/467 |
| 4,132,168 | 1/1979 | Peterson | 101/471 |
| 4,188,880 | 2/1980 | Figov et al. | 101/128.21 |
| 4,245,003 | 1/1981 | Oransky et al. | 428/323 |
| 4,304,806 | 12/1981 | Anderson et al. | 428/65 |
| 4,309,495 | 1/1982 | Ernsberger | 430/5 |
| 4,376,943 | 3/1983 | Bahr et al. | 346/135.1 |
| 4,383,016 | 5/1983 | Postupack | 430/5 |
| 4,392,143 | 7/1983 | Bahr et al. | 346/135.1 |
| 4,550,061 | 10/1985 | Sachdev et al. | 428/461 |
| 4,554,562 | 11/1985 | Afzali-Ardakani et al. | 346/135.1 |
| 4,567,490 | 1/1986 | Afzali-Ardakani et al. | 346/135.1 |
| 4,588,674 | 5/1986 | Stewart et al. | 430/273 |
| 4,596,733 | 6/1986 | Cohen et al. | 428/209 |
| 4,617,579 | 10/1986 | Sachdev et al. | 346/135.1 |
| 4,622,262 | 11/1986 | Cohen | 428/219 |
| 4,711,834 | 12/1987 | Butters et al. | 430/201 |
| 4,718,340 | 1/1988 | Love, III | 101/116 |
| 4,729,310 | 3/1988 | Love, III | 101/157 |
| 4,836,106 | 6/1989 | Afzali-Ardakani et al. | 101/467 |
| 4,894,279 | 1/1990 | Sachdev et al. | 428/216 |
| 4,911,075 | 3/1990 | Lewis et al. | 101/453 |
| 4,915,519 | 4/1990 | Afzali-Ardakani et al. | 400/120 |
| 5,023,156 | 6/1991 | Takeuchi et al. | 430/5 |
| 5,084,331 | 1/1992 | Afzali-Ardakani et al. | 428/219 |
| 5,091,052 | 2/1992 | Nowak et al. | 156/643 |
| 5,156,938 | 10/1992 | Foley et al. | 430/200 |
| 5,171,650 | 12/1992 | Ellis et al. | 430/20 |
| 5,178,976 | 1/1993 | Rose et al. | 430/5 |
| 5,217,829 | 6/1993 | Nowak et al. | 430/5 |
| 5,262,275 | 11/1993 | Fan | 430/273 |
| 5,298,351 | 3/1994 | Bobroff et al. | 430/5 |

FOREIGN PATENT DOCUMENTS

| | | | |
|---|---|---|---|
| 0113005 | 7/1984 | European Pat. Off. | B51M 5/24 |
| 3930797 | 3/1990 | Fed. Rep. of Germany | G03F 7/11 |
| 64-30786 | 2/1989 | Japan | B41M 5/24 |
| 8402308 | 6/1984 | PCT Int'l Appl. | B41M 5/24 |
| 9207716 | 5/1992 | PCT Int'l Appl. | B41C 1/10 |

OTHER PUBLICATIONS

E. B. Cargill et al., *A Report On Polaroid's New Dry Imaging Technology for Generating 8×10 Radiographic Films*, (Jan. 1993).

E. B. Cargill et al., *A Report on the Image Quality Characteristics of the Polaroid Helios Laser System*, (Oct. 1992).

Russian article entitled *Longlived Collective Excitation of Electrons in Silicone Rubber*.

*Primary Examiner*—Steve Rosasco
*Attorney, Agent, or Firm*—Cesari and McKenna

[57] ABSTRACT

Novel photomask blanks and methods for producing photomasks using laser-imaging apparatus. The photomask blanks include at least one layer that absorbs laser energy and ablates in response thereto, and, where unremoved as a result of the imaging process, perform the masking function by blocking the passage of actinic radiation; and a a mechanically strong, durable and flexible substrate that is substantially transparent to actinic radiation.

12 Claims, 1 Drawing Sheet

LASER IMAGEABLE PHOTOMASK CONSTRUCTIONS

BACKGROUND OF THE INVENTION

1. Field of the Invention

The present invention relates to production of photomasks, and more particularly to a method for producing photomasks using digitally controlled laser output, as well as constructions therefor.

2. Description of the Related Art

Photosensitive media find application in a wide variety of industrial and commercial contexts. These include preparation of offset lithography masters, printed circuit boards and silkscreen stencils.

In typical applications, a photosensitive substrate is exposed to a source of illumination that passes through a transparency containing a negative rendition (typically in black-and-white tones) of the image to be printed, thereby exposing the non-image portions of the substrate. Hereinafter, this transparency is referred to as the "mask" or "photomask." The substrate is then developed using conventional or specialized photochemical processes, resulting in a finished article having the desired black-and-white pattern imprinted thereon.

Conventionally, the mask is also prepared photographically. For example, a camera can be employed to record an image onto sheet film coated with a photosensitive silver halide emulsion, and the latter subjected to well-known development and fixation processes. This method, while reliable, suffers from the expense and inconvenience associated with "wet" processes generally. The silver halide emulsion adds further cost to the transparency material.

Offset lithography represents one application in which photomasks are frequently employed. Lithographic plates are produced by selectively modifying the surface characteristics of a blank so as to facilitate image retention and transfer. In one common arrangement, the surface of a blank plate ordinarily repels organic materials, such as ink, but is receptive to an ink-repellent fountain solution. Upon exposure to suitable radiation (generally followed by some type of development process), the affinities of the surface material reverse, with the exposed areas becoming ink-receptive and repellent to fountain solution. Accordingly, one can impress an ink-transfer pattern on the blank by exerting control over the portions of the blank that receive exposure to the actinic radiation. This control is provided by the mask, which is introduced between the blank and the source of radiation.

A similar process can be used to etch a finished printed circuit board from a blank having a conductive layer that is sensitive to radiation. Introduction of a suitably imaged mask between a blank ensures that only the proper portions of the blank receive radiation. Either the exposed or unexposed portions are removed during the etching process.

In screen printing, a printing substance such as ink or a dispersion of toner particles is passed through a partially blocked porous mesh screen to a receiving substrate. The nonimage areas of the screen are blocked with a suitable material impervious to the printing substance in a pattern corresponding to a reversal of the desired image. The ink can be applied to the screen and directed therethrough by pressure and/or electrostatic forces.

The patterned mesh screen, or stencil, is generally prepared using some form of photoresist to selectively furnish the ink-impermeable non-image areas. In one commonly used process, a hydrocolloid (e.g., gelatin or polyvinyl alcohol) that has been treated so as to polymerize upon exposure to illumination is first coated on the blank porous mesh; additional coatings are then applied, as necessary, to avoid pinholes.

The prepared screen is then exposed to a source of illumination that passes through a suitably patterned photomask. In this case, however, the mask contains a positive rendition of the final image, rather than a negative. The exposed screen is transformed into a finished printing screen by "development" (e.g., washing with water jets) to remove the unpolymerized coating material.

One method of preparing the mask comprises projecting the on-film image recorded by a camera onto a piece of sheet film coated with a photosensitive silver halide emulsion, and subjecting the latter to conventional development and fixation processes. This photographic method suffers from the same shortcomings outlined above with respect to wet photographic processes generally.

One can largely avoid these disadvantages by using the spark-erosion recording techniques described in U.S. Pat. Nos. 4,188,880 and 5,217,829. Contact and non-contact spark-imaging techniques offer speed, convenience, and appreciable reduction in the cost of producing each photomask, as well as amenability to computer control. However, for many applications—particularly those requiring highly precise placement of very fine image features—spark imaging proves less than ideal, especially when the final product must be comparable in resolution to that obtainable using traditional photographic techniques.

DESCRIPTION OF THE INVENTION

A. Brief Summary of the Invention

The present invention enables rapid, efficient production of photomasks using laser equipment, and the approach contemplated herein may be applied to any of a variety of laser sources that emit in various regions of the electromagnetic spectrum. All constructions of the present invention utilize materials that enhance the ablative efficiency of the laser beam. Substances that do not heat rapidly or absorb significant amounts of radiation will not ablate unless they are irradiated for relatively long intervals and/or receive high-power pulses.

The method of the present invention comprises use of a digitally controlled laser (such as that described in copending application Ser. No. 07/917,481, filed Jul. 20, 1992, now abandoned, commonly owned with the present application and hereby incorporated by reference) to destroy, at selected points, an opaque "masking layer" (or layers) of a composite substrate to reveal a "transmission layer" (or layers) thereunder. The process of selective removal is hereinafter referred to as "imaging". For ease of presentation, reference to a "layer" may connote one or more plies that collectively perform the noted function.

In our method, a digital representation of the negative or positive image that is to be transferred to the photosensitive material is stored as a datafile accessible by a suitably programmed computer. The computer directs the operation of control circuitry that manipulates the position of the laser with respect to the construction to be imaged, and causes actuation of the laser when appropriate.

It should be understood that the choice between positive and negative image rendering depends both on the nature of the final product and the inclination of the designer. For example, as discussed hereinabove, by its nature the silkscreen process ordinarily entails use of a photomask having a positive pattern corresponding to the desired inking pattern. Lithographic plates, on the other hand, can be exposed either through a negative or positive photomask, depending on the type of plate. See, e.g., P. Hartsuch, *Chemistry for the Graphic Arts* (1983) at 127–178 for a description of negative and positive lithographic plates.

After imaging is completed, the composite substrate will have transparent areas corresponding to negative or positive portions of the final image, depending on design choice, with the remaining areas opaque. By "opaque" and "transparent" we refer to the ability either to substantially prevent transmission, or to refrain from materially interfering with transmission, of the radiation employed in the application for which the mask is designed (hereafter "actinic radiation"). The finished construction is used as the screen mask that intervenes between a source of actinic radiation and a radiation-sensitive material during exposure thereof.

B. Brief Description of the Drawing

The foregoing discussion will be understood more readily from the following detailed description of the invention, when taken in conjunction with the single figure of the drawing that illustrates an enlarged sectional view of a photomask blank in accordance with the present invention.

C. Detailed Description of the Preferred Embodiments

1. Imaging Apparatus

Imaging apparatus suitable for use in conjunction with the present photomasks includes at least one laser device that emits in the region of the opaque layer's maximum responsiveness, i.e., whose lambda$_{MAX}$ closely approximates the wavelength region where the opaque layer absorbs most strongly. Specifications for lasers that emit in the near-IR region are fully described in the '481 application; lasers emitting in other regions of the electromagnetic spectrum are well-known to those skilled in the art.

Suitable imaging configurations are also set forth in detail in the '481 application. Briefly, laser output can be provided directly to the photomask surface via lenses or other beam-guiding components, or transmitted thereto from a remotely sited laser using a fiber-optic cable. A controller and associated positioning hardware maintains the beam output at a precise orientation with respect to the photomask surface, scans the output over the surface, and activates the laser at positions adjacent selected points or areas of the photomask. The controller responds to incoming image signals corresponding to the original document or picture being copied onto the photomask to produce a precise negative or positive image of that original. The image signals are stored as a bitmap datafile on a computer. Such files may be generated by a raster image processor (RIP) or other suitable means. For example, a RIP can accept input data in page-description language, which defines all of the features required to be transferred onto the photomask, or as a combination of page-description language and one or more image data files.

The components of the imaging system may be arranged around a drum, which bears the photomask blank. In this configuration, the requisite relative motion between the laser beam and the photomask is achieved by rotating the drum (and the photomask mounted thereon) about its axis and moving the beam parallel to the rotation axis, thereby scanning the plate circumferentially so the photomask pattern "grows" in the axial direction. Alternatively, the beam can move parallel to the drum axis and, after each pass across the plate, increment angularly so that the pattern "grows" circumferentially. In both cases, after a complete scan by the beam, an image corresponding (positively or negatively) to the original stored pattern will have been applied to the photomask.

Alternatively, in a flatbed configuration, the beam is drawn across either axis of the photomask, and is indexed along the other axis after each pass. Of course, the requisite relative motion between the beam and the photomask may be produced by movement of the mask rather than (or in addition to) movement of the beam.

Regardless of the manner in which the beam is scanned, it is often preferable to employ a plurality of lasers and guide their outputs to a single writing array. The writing array is then indexed, after completion of each pass across or along the plate, a distance determined by the number of beams emanating from the array, and by the desired resolution (i.e, the number of image points per unit length). Alternatively, using configurations designed to accommodate very rapid movement of a blank mask (e.g., through use of high-speed motors) and which can thereby utilize high laser pulse rates, one can practically utilize a single laser as an imaging source.

2. Photomask Constructions

Refer to FIG. 1, which illustrates a representative embodiment of a photomask in accordance with the present invention. The depicted construction illustrated in FIG. 1 includes a protective surface layer 100; a series of layers 102, 104, 106 that absorb laser energy and ablate in response thereto, and, where unremoved as a result of the imaging process, perform the masking function by blocking the passage of actinic radiation; and a substrate 108.

a. Surface Layer 100

Surface layer 100, which is optional, protects the mask from damage due to routine handling. In one embodiment, surface layer 100 is a thin polymeric film cast from solvent. The film should be easily ablated; in particular, a high local temperature should cause depolymerization to low-molecular-weight species that readily volatilize, resulting in relatively complete elimination with little or no residue. Suitable polymers include (but are not limited to) those derived from α-substituted acrylate monomers, including polymethylmethacrylate (PMMA), polymethyltrifluoromethacrylate, polyfluorobutylmethacrylate, polyethylmethacrylate, polymethacrylic acid, polymethacrylic anhydride, methylmethacrylate-methacrylic anhydride copolymer, methylmethacrylate-methacrylic acid copolymer, and polyphenylmethacrylate; a-substituted styrene polymers as described in U.S. Pat. No. 4,550,061, the entire disclosure of which is hereby incorporated by reference; polymers derived from vinyl ketone monomers as described in the '061 patent; polyoxymethylene; polycarbonates; polyesters; polyurethanes; styrene/acrylonitrile polymer; cellulosic ethers and esters; polyacetals; and combinations ( e.g., copolymers or terpolymers) of the foregoing. The polymers may also be crosslinked to maximize abrasion resistance. Preferably, the polymeric layer is applied to a thickness of 0.1 mil or less, or deposited uniformly at 1 g/m$^2$.

In a second embodiment, surface layer 100 is a thin, abrasion-resistant inorganic layer that performs the dual functions of radiation absorption and abrasion resistance (facilitating elimination of layer 102). In one preferred approach, a TiO layer thick 200–700 Å is deposited onto layer 104 using electron-beam evaporation. This approach, as well as techniques such as sputtering and vacuum evaporation, can be used to deposit TiO or other hard, durable inorganic layers suitable for coating such as TiO variants of the formula TiO$_x$ where $0.8 < X < 2$; TiN; TiC; WC; compounds of the formula VO$_x$, where $0.8 < X < 2.5$ (e.g., V$_6$O$_{13}$); compounds of the formula WO$_x$, where $2 < X < 3$ (e.g., WO$_{2.9}$); or Co$_3$O$_4$. These layers can also be applied in combination, each layer being present in thickness ranging from 100 to 700 Å.

In a third embodiment, suitable for use with imaging lasers that emit in the visible or infrared (IR) spectral regions, surface layer 100 is a carbon-filled coating deposited on an underlying two-layer construction in which layers 100 and 102 absorb imaging radiation and layer 104 is a metal, such as aluminum, that combines with surface layer 100 to provide sufficient opacity to perform the masking function. This approach permits the use of relatively thin individual layers. During imaging, layer 102 absorbs a large proportion of incident imaging radiation, becoming sufficiently hot both to ablate and to ignite layer 104 so that it, too, is destroyed. Preferably, the carbon-filled coating of this embodiment is approximatley 0.1 mil thick, or deposited uniformly at 1–2 g/m$^2$; however, the precise thickness can vary depending on the thickness of the metal layer 104, so long as the overall result is to provide both adequate opacity and proper ablative response to imaging radiation.

EXAMPLE 1

A suitable carbon-filled coating can be produced from the following nitrocellulose base composition:

| Component | Parts |
|---|---|
| Nitrocellulose | 14 |
| Cymel 303 | 2 |
| 2-Butanone (methyl ethyl ketone) | 236 |

The nitrocellulose utilized is the 30% isopropanol wet 5-6 Sec RS Nitrocellulose supplied by Aqualon Co., Wilmington, Del. Cymel 303 is hexamethoxymethylmelamine, supplied by American Cyanamid Corp.

Equal parts of carbon black (specifically, the Vulcan XC72 conductive carbon black pigment supplied by the Special Blacks Division of Cabot Corp., Waltham, Mass.) and NaCure 2530, an amine-blocked p-toluenesulfonic acid solution in an isopropanol/methanol blend which is supplied by King Industries, Norwalk, Conn., are combined with the base nitrocellulose composition in proportions of 4:4:252. The resulting composition may be applied using a wire-wound rod. In particular, after drying to remove the volatile solvent(s) and curing (1 min. at 300° F. in a lab convection oven performed both functions), the coating is preferably deposited at 1 g/m$^2$.

b. Layer 102

Layer 102 interacts with and absorbs imaging radiation, which causes it to ablate. Although in theory one could employ a fully opaque, radiation-absorptive layer 102 in conjunction with a suitable transparent substrate, in practice we have found this approach unworkable in commercially realistic imaging environments that require rapid production rates. Instead, it is preferable to utilize a multilayer construction in which layer 102 is partially transmissive, and is opaque only when combined with an underlying layer or layers and, optionally, with an overlying layer as well. In the IR embodiment described above, layer 102 can be, for example, TiO deposited at a thickness of 100 Å or less. Upon exposure to IR radiation, the TiO heats rapidly, igniting the underlying metal layer 104. To the extent that layer 102 contributes to overall opacity, its thickness in support of this function can be minimized by use of a surface layer 100 that partially blocks transmission of actinic radiation (such as the carbon-filled coating mentioned above) and/or by utilizing an underlying layer 104 that is as thick as possible (given the constraint that it must fully ablate when ignited by layer 102).

Organic chromophores can also be used to confer radiation-absorption properties to layer 102. Such materials are desirably soluble or easily dispersed in the material which, when cured, functions as layer 102, and must be capable of provide adequate opacity when combined with the other layers. IR-absorptive dyes include a variety of phthalocyanine and naphthalocyanine compounds, while chromophores that absorb in the ultraviolet region include benzoin, pyrene, benzophenone, acridine, 4-aminobenzoylhydrazide, 2-(2'-hydroxy-3',5'-diisopentylphenyl)benzotriazole, rhodamine 6G, tetraphenylporphyrin, hematoporphyrin, ethylcarbazole, and poly(N-vinylcarbazole). Generally, suitable chromophores can be found to accommodate imaging using virtually any practicable type of laser. See, e.g., U.S. Pat. Nos. 5,156,938 and 5,171,650 (the entire disclosures of which are hereby incorporated by reference). The chromophores concentrate laser energy within the absorbing layer and cause its destruction, disrupting and preferably consuming the surface layer as well, and initiating the controlled decomposition of the secondary ablation layer.

Another visible-spectrum and IR-compatible embodiment utilizes a carbon-black-filled coating for layer 102, at the thicknesses described above in connection with carbon-filled layer 100, in combination with a layer 100 that is transparent (or omitted entirely) and a very thin metal layer 104 as described below; once again, the nitrocellulose coating described in Example 1 provides worthwhile performance in this context as the material of layer 102.

c. Layer 104

Layer 104 combines with the overlying layers to provide the necessary opacity to actinic radiation. Preferably, this layer is aluminum. Although it is possible to substitute other metals such as chromium, nickel, zinc, copper, or titanium for aluminum, the latter is preferred for ease of ablation and favorable environmental and toxicity characteristics.

In the embodiment using a layer 102 that does not provide significant opacity, layer 104 preferably transmits 1% or less of actinic radiation impinging thereon, but nonetheless ablates fully when ignited by layer 102. In conjunction with the TiO (or other inorganic) layer described above, aluminum deposited to a thickness of at least 300 Å, and preferably to about 500 Å, serves well. For masks requiring very high degrees of opacity, or in conjunction with a dye-filled layer 102, this aluminum layer can be applied at higher thickness and/or combined with a carbon-filled surface layer 100.

In the embodiment using a more opaque (e.g., carbon-filled) layer 102, layer 104 can, absent the need for very high degrees of opacity, be considerably thinner. In conjunction with a carbon-filled layer 102, aluminum deposited at a thickness of 100 Å, and preferably 50 Å or less, can be employed advantageously.

d. Layer 106

Layer 106 is optional, and is utilized when ablation of the overlying layers would char or otherwise interfere with the transmissive characteristics of substrate 108. This "secondary ablation layer" ablates "cleanly"—that is, exhibits sufficient thermal instability as to decompose rapidly and uniformly upon application of heat, evolving primarily gaseous decomposition products. Preferred materials undergo substantially complete thermal decomposition (or pyrolysis) with limited melting or formation of solid decomposition products, and are typically based on chemical structures that readily undergo, upon exposure to sufficient thermal energy, eliminations ( e.g., decarboxylations ) and rearrangements producing volatile products.

Layer 106 is applied at a thickness sufficient to ablate only partially in response to the heat produced by ablation of the overlying layers.

Materials suitable for use in layer 106 include polymers that exhibit limited thermal stability, and which are substantially transparent to actinic radiation. Especially useful polymers, which are largely transparent to a wide range of spectral frequencies, include PMMA and its derivatives (including copolymers, terpolymers, etc. ), polycarbonates, polyesters, polyurethanes, polystyrenes, styrene/acrylonitrile polymer, cellulosic ethers and esters, polyacetals, and combinations (e.g., copolymers or terpolymers)of the foregoing. Layer 106 can also be chosen to improve adhesion between layers 104 and 108.

Layer 106 is applied to a thickness adequate to avoid complete ablation in response to the thermal flux originating in the ablation of the overlying layers. Useful thicknesses range from a minimum of 1 micron, with upper limits dictated primarily by economics (e.g., 30 microns or more); a typical working range is 4–10 microns. The following formulations can be utilized on polyester film substrates:

EXAMPLES 2–4

| Component | Example 2 | Example 3 | Example 4 |
|---|---|---|---|
| | Parts | | |
| 2-Butanone | 65 | 70 | 81.5 |
| Normal Propyl Acetate | 20 | — | — |
| Acryloid B-44 | 10 | — | — |
| Doresco AC2-79A | — | 25 | — |
| Cargill 72-7289 | — | — | 13.5 |
| Cymel 303 | 4 | 4 | 4 |
| Cycat 4040 | 1 | 1 | 1 |

Acryloid B-44 is an acrylic resin supplied by Rohm & Haas, Philadelphia, Pa. Doresco AC2-79A is a 40%-solids acrylic resin solution in toluene, and is supplied by Dock Resins Corp., Linden, N.J. Cargill 72-7289 is a 75%-solids polyester resin solution in propylene glycol monopropyl ether supplied by Cargill Inc., Carpentersville, Ill. Cycat 4040 is a 40%-solids paratoluene sulfonic acid solution in isopropanol supplied by American Cyanamid Co., Wayne, N.J. The compositions of Examples 2–4 are well-suited to use on polyester substrates.

e. Substrate 108

Substrate 108 is preferably mechanically strong, durable and flexible, and also possesses a high degree of optical clarity, high transmissivity (preferably in excess of 99%) with respect to actinic radiation, and is free from surface defects capable of scattering incident actinic radiation. Suitable grades of polymer film function best. Useful examples include polyester, polystyrene, polycarbonate, polymethylpentene, acetate, acrylic or polyether, or derivatives of any of the foregoing (e.g., copolymers and terpolymers), and combinations thereof.

Using any of the aforementioned materials, the thickness of substrate 108 will preferably be greater than 0.001 inch (for toughness) but less than 0.01 inch (to preserve optical clarity and minimize cost). In an especially preferred embodiment, the thickness of substrate 108 ranges from 0.005 to 0.007 inch.

It will therefore be seen that we have developed a highly versatile system for the production of photomasks, as well as a variety of constructions for use therewith. None of our constructions need contain the lubricants or rough particles that have characterized many prior-art systems. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A photomask construction for use in conjunction with a source of actinic radiation, the construction comprising:
   a. an ignition layer at least partially opaque to actinic radiation and ignitable by exposure to laser radiation;
   b. an ignitable metal layer at least partially opaque to actinic radiation and which combines with the first layer to block at least 99% of incident actinic radiation, the metal layer ablating in response to combustion of the ignition layer;
   c. a mechanically strong, durable and flexible third layer that is substantially transparent to actinic radiation.

2. The construction of claim 1 further comprising a protective, overlying polymeric surface layer.

3. The construction of claim 1 further comprising a protective, overlying, abrasion-resistant inorganic surface layer.

4. The construction of claim 3 wherein at least one of the ignition layer and the inorganic surface layer is fabricated from at least one material selected from the group consisting of compounds of the formula $TiO_x$, where $0.8 < X < 2$; TiN; TiC; WC; compounds of the formula $VO_x$, where $0.8 < X < 2.5$; compounds of the formula $WO_x$, where $2 < X < 3$; and $Co_3O_4$.

5. The construction of claim 1 wherein the metal layer is a metal selected from the group consisting of aluminum, chromium, nickel, zinc, copper, and titanium.

6. The construction of claim 1 wherein the ignition layer preferentially absorbs IR radiation.

7. The construction of claim 1 wherein the ignition layer preferentially absorbs ultraviolet radiation.

8. The construction of claim 1 wherein:
   a. The ignition layer is TiO; and
   b. The metal layer is aluminum.

9. The construction of claim 8 wherein the TiO layer is no thicker than 100 Å and the metal layer is at least 200 Å thick.

10. The construction of claim 1 wherein the third layer is at least 0.001 inch thick and no greater than 0.01 inch thick.

11. A photomask construction for use in conjunction with a source of actinic radiation, the construction comprising:
   a. a first layer at least partially opaque to actinic radiation;
   b. a metal layer at least partially opaque to actinic radiation and which combines with the first layer to block at least 99% of incident actinic radiation;
   c. a mechanically strong, durable and flexible third layer that is substantially transparent to actinic radiation; and
   d. a fourth layer located between the metal and third layers, the fourth layer:
      i. exhibiting limited thermal stability; and
      ii. having sufficient thickness to ablate only partially in response to ablation of the metal layer.

12. The construction of claim 11 wherein the fourth layer is selected from the group consisting of polymethylmethacrylate, polycarbonates, polyesters, polyurethanes, polystyrenes, styrene/acrylonitrile polymer, cellulosic ethers and esters, polyacetals, and combinations thereof.

* * * * *